United States Patent
Matsumoto

(10) Patent No.: US 12,113,566 B2
(45) Date of Patent: Oct. 8, 2024

(54) RADIO FREQUENCY MODULE

(71) Applicant: Murata Manufacturing Co., Ltd., Kyoto (JP)

(72) Inventor: Shou Matsumoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/088,929

(22) Filed: Nov. 4, 2020

(65) Prior Publication Data

US 2021/0050876 A1 Feb. 18, 2021

Related U.S. Application Data

(63) Continuation of application No. PCT/JP2019/028247, filed on Jul. 18, 2019.

(30) Foreign Application Priority Data

Jul. 23, 2018 (JP) .................. 2018-137535

(51) Int. Cl.
*H04B 1/40* (2015.01)
*H05K 1/02* (2006.01)

(52) U.S. Cl.
CPC ............. *H04B 1/40* (2013.01); *H05K 1/0213* (2013.01); *H05K 2201/10098* (2013.01); *H05K 2201/10984* (2013.01)

(58) Field of Classification Search
CPC ................... H04B 1/44; H04B 17/318; H04B 2001/0408; H04B 7/0626; H04B 7/0695;
(Continued)

(56) References Cited

U.S. PATENT DOCUMENTS

2003/0103006 A1 6/2003 Yamada
2007/0066243 A1 3/2007 Yamauchi et al.
(Continued)

FOREIGN PATENT DOCUMENTS

JP 2007158157 A 6/2007
JP 2011040602 A 2/2011
(Continued)

OTHER PUBLICATIONS

International Search Report issued in Application No. PCT/JP2019/028247, dated Oct. 8, 2019.
(Continued)

*Primary Examiner* — Ajibola A Akinyemi
(74) *Attorney, Agent, or Firm* — Pearne & Gordon LLP

(57) ABSTRACT

A radio frequency module includes a power amplification element, a transmission filter, and a transmission matching element, which are transmission-only components for processing only a transmission signal, a low noise amplification element, a reception filter, and a reception matching element, which are reception-only components for processing only a reception signal, an antenna switch, which is a transmission-reception dual-use component for processing both a transmission signal and a reception signal, and a first module board and a second module board, which are arranged to face each other. The transmission-only components are mounted on a main surface of the first module board, and the reception-only components and the transmission-reception dual-use component are mounted on respective main surfaces of the second module board.

15 Claims, 4 Drawing Sheets

(58) Field of Classification Search
CPC ...... H04B 1/0483; H04B 1/40; H04B 7/0413;
H04B 7/0456; H04B 7/0617; H04B
7/088; H04B 10/114; H04B 10/40; H04B
17/345; H04B 1/0053; H04B 1/006;
H04B 1/0475; H04B 1/16; H04B 1/1607;
H04B 1/1615
USPC .......................................................... 455/73
See application file for complete search history.

(56) References Cited

U.S. PATENT DOCUMENTS

| | | | |
|---|---|---|---|
| 2007/0127725 A1 | 6/2007 | Tominaga et al. | |
| 2010/0061735 A1* | 3/2010 | Minota .................. | H05K 1/148 398/139 |
| 2011/0037170 A1 | 2/2011 | Shinohara | |
| 2011/0317373 A1* | 12/2011 | McDermid ............ | H05K 1/144 361/736 |
| 2019/0319717 A1* | 10/2019 | Choi ........................ | H04B 1/44 |
| 2020/0091608 A1* | 3/2020 | Alpman ............... | H01Q 9/0414 |

FOREIGN PATENT DOCUMENTS

| | | |
|---|---|---|
| WO | 0203499 A1 | 1/2002 |
| WO | 2006035518 A1 | 4/2006 |

OTHER PUBLICATIONS

Written Opinion issued in Application No. PCT/JP2019/028247, dated Oct. 8, 2019.

* cited by examiner

RADIO FREQUENCY MODULE

CROSS REFERENCE TO RELATED APPLICATIONS

This is a continuation of International Application No. PCT/JP2019/028247 filed on Jul. 18, 2019 which claims priority from Japanese Patent Application No. 2018-137535 filed on Jul. 23, 2018. The contents of these applications are incorporated herein by reference in their entireties.

BACKGROUND

The present disclosure relates to a radio frequency module.

In mobile communication devices, such as mobile phones, in particular, as multiband support has been developed, the number of circuit elements included in a radio frequency front-end circuit increases.

In Japanese Unexamined Patent Application Publication No. 2011-040602, a semiconductor module populated with electronic components on both surfaces of a wiring substrate is disclosed. The electronic components used in the semiconductor module include a low-noise amplifier, a power amplifier, an antenna switch, and a filter.

However, in the semiconductor module disclosed in Japanese Unexamined Patent Application Publication No. 2011-040602, in a case where the power amplifier, the low-noise amplifier, and the antenna switch are arranged on the same plane of the wiring board, a transmission signal flows through a transmission path including the power amplifier is likely to enter a reception path including the low noise amplifier. Thus, the degree of transmission-reception isolation decreases.

BRIEF SUMMARY

The present disclosure provides a radio frequency module for which the degree of transmission-reception isolation has improved.

A radio frequency module according to embodiments of the present disclosure includes a first component, which is one of a transmission-only component, a reception-only component, and a transmission-reception dual-use component, the transmission-only component processing only a transmission signal, the reception-only component processing only a reception signal, the transmission-reception dual-use component processing both a transmission signal and a reception signal, a second component, which is another one of the transmission-only component, the reception-only component, and the transmission-reception dual-use component, a first module board, and a second module board, which is arranged so as to face the first module board. The first component is mounted on a first main surface, which is one of four main surfaces that are one main surface and another main surface of the first module board and one main surface and another main surface of the second module board, and the second component is mounted on a second main surface, which differs from the first main surface and is one of the four main surfaces.

In addition, a radio frequency module according to embodiments of the present disclosure includes a fourth component, which is one of a transmission-only component, a reception-only component, and a transmission-reception dual-use component, the transmission-only component processing only a transmission signal, the reception-only component processing only a reception signal, the transmission-reception dual-use component processing both a transmission signal and a reception signal, a fifth component, which is another one of the transmission-only component, the reception-only component, and the transmission-reception dual-use component, and a third module board. The fourth component is mounted on a fourth main surface, which is one main surface of the third module board, and the fifth component is mounted in an inner layer of the third module board.

According to the embodiments of the present disclosure, two components among the transmission-only component, the reception-only component, and the transmission-reception dual-use component are assigned to and mounted on respective different main surfaces of the module boards or are each assigned to a corresponding one of a main surface and an inner layer of the module board and are mounted on the main surface and in the inner layer. Consequently, compared with a configuration in which the two components are mounted on the same main surface or in an inner layer of a module board, a transmission signal flowing through a transmission path including at least one of the transmission-only component and the transmission-reception dual-use component is less likely to enter a reception path including at least one of the reception-only component and the transmission-reception dual-use component, and thus the degree of transmission-reception isolation improves.

Other features, elements, characteristics and advantages of the present disclosure will become more apparent from the following detailed description of embodiments of the present disclosure with reference to the attached drawings.

DETAILED DESCRIPTION

In the following, embodiments of the present disclosure will be described in detail using the drawings. Note that the embodiments described below each illustrates a general or specific example. The numerical values, shapes, materials, structural elements, and arrangement and connection forms of the structural elements described in the following embodiments are examples, and they are not intended to limit the present disclosure.

First Embodiment

A radio frequency module according to a first embodiment will be described taking as an example a radio frequency module in which a transmission-only component, a reception-only component, and a transmission-reception dual-use component are mounted on respective different main surfaces of two module boards arranged so as to face each other.

Note that the transmission-only component is a component that processes only transmission signals, the reception-only component is a component that processes only reception signals, and the transmission-reception dual-use component is a component that processes both transmission signals and reception signals. The transmission signals may include not only a substantive signal to be transmitted but also a control signal used in processing of the signal (for example, a bias signal for power amplification). Similarly, the reception signals may include not only a substantive signal that is received but also a control signal used in processing of the signal (for example, a bias signal for low-noise amplification).

In the following, first, a functional circuit configuration of a radio frequency module will be described, and then the structural characteristics of the radio frequency module will be described in detail.

Figure 1:
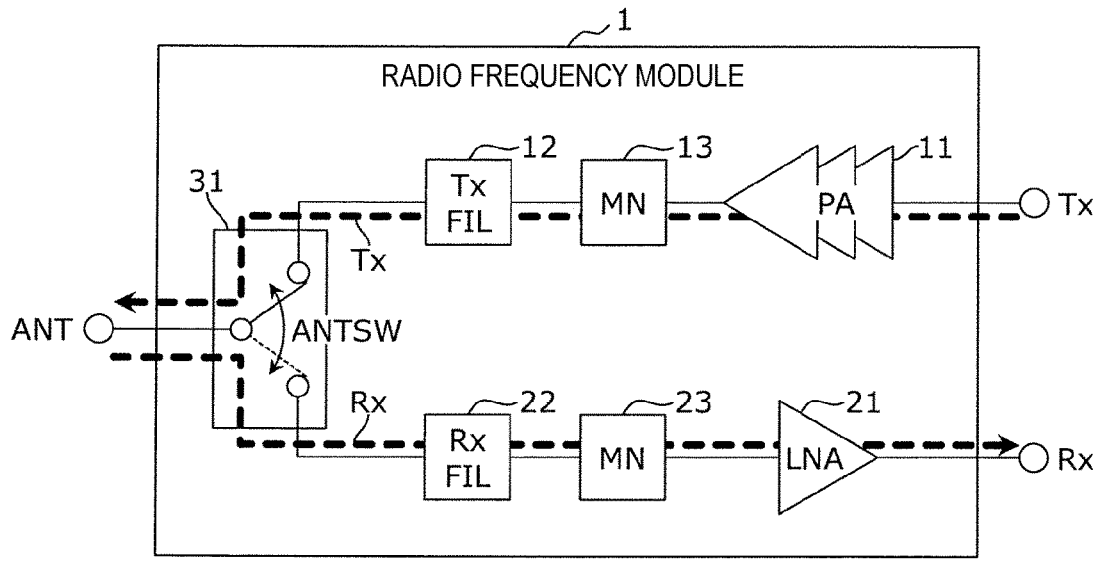
FIG. 1 is a block diagram illustrating an example of a functional circuit configuration of a radio frequency module according to a first embodiment.

FIG. 1 is a block diagram illustrating an example of a functional circuit configuration of the radio frequency module according to the first embodiment. As illustrated in FIG. 1, a radio frequency module 1 is a front-end module for processing a transmission signal Tx and a reception signal Rx. The radio frequency module 1 includes a power amplification element 11, a transmission filter 12, a transmission matching element 13, a low noise amplification element 21, a reception filter 22, a reception matching element 23, and an antenna switch 31.

The power amplification element 11 amplifies a transmission signal Tx received through a transmission signal terminal Tx and supplies the amplified transmission signal Tx to the transmission filter 12. The transmission matching element 13 realizes matching at the output end of the power amplification element 11. The transmission matching element 13 includes an inductor and a capacitor. The transmission filter 12 supplies, to the antenna switch 31, a signal component of a transmission band included in the transmission signal Tx received from the power amplification element 11 via the transmission matching element 13.

The reception filter 22 supplies, to the low noise amplification element 21, a signal component of a reception band included in a reception signal Rx received from the antenna switch 31. The reception matching element 23 realizes matching at the input end of the low noise amplification element 21. The reception matching element 23 includes an inductor and a capacitor. The low noise amplification element 21 amplifies the reception signal Rx received from the reception filter 22 via the reception matching element 23 and supplies the amplified reception signal Rx to a reception signal terminal Rx.

The antenna switch 31 selectively connects one of a transmission path and a reception path to an antenna terminal ANT, which is a common terminal. The transmission path includes the power amplification element 11, the transmission filter 12, and the transmission matching element 13. The reception path includes the low noise amplification element 21, the reception filter 22, and the reception matching element 23.

Thus, in the radio frequency module 1, the transmission signal Tx amplified by the power amplification element 11 is output via the antenna switch 31, and the reception signal Rx acquired via the antenna switch 31 is amplified by the low noise amplification element 21.

In this case, the power amplification element 11, the transmission filter 12, and the transmission matching element 13 are examples of the transmission-only component. The low noise amplification element 21, the reception filter 22, and the reception matching element 23 are examples of the reception-only component. The antenna switch 31 is an example of the transmission-reception dual-use component.

Note that the circuit configuration of the radio frequency module 1 is not limited to the example in FIG. 1. For example, some or all of the transmission filter 12, the transmission matching element 13, the reception filter 22, and the reception matching element 23 may be omitted. Moreover, for example, instead of the antenna switch 31, a duplexer that demultiplexes and multiplexes the transmission signal Tx and the reception signal Rx may be provided (not illustrated). The duplexer is an example of the transmission-reception dual-use component.

Figure 2:
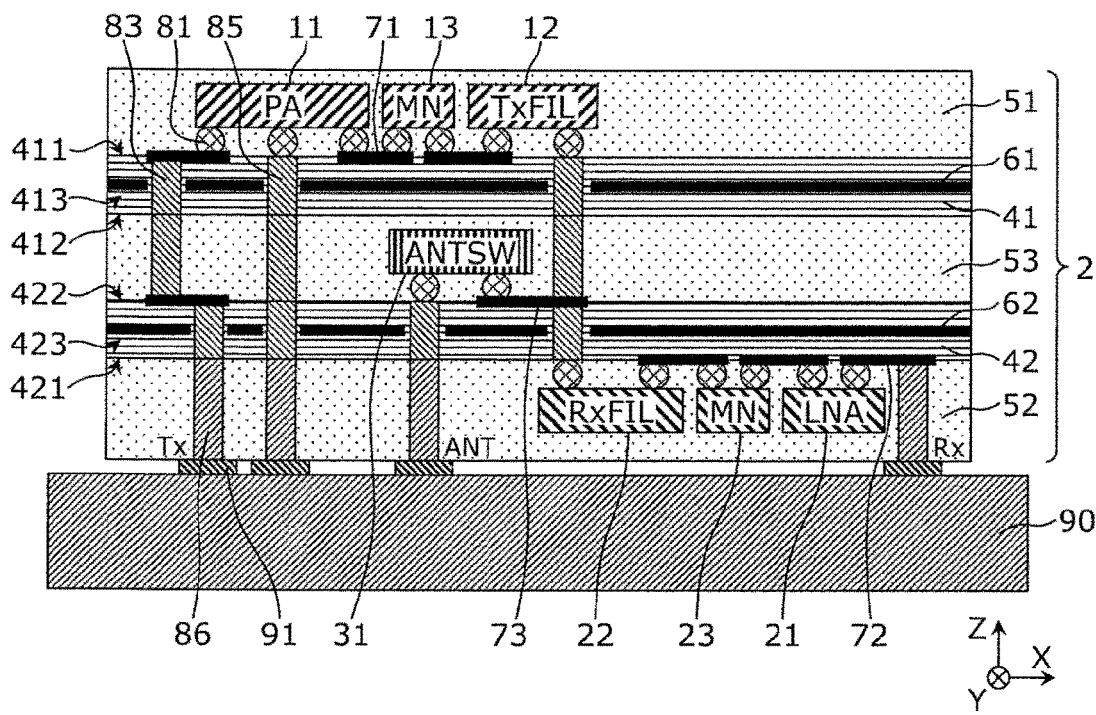
FIG. 2 is a side view illustrating an example of the configuration of the radio frequency module according to the first embodiment.

FIG. 2 is a side view illustrating an example of the configuration of the radio frequency module according to the first embodiment. A radio frequency module 2 in FIG. 2 illustrates an example of a specific configuration of the radio frequency module 1 in FIG. 1. Note that, in FIG. 2, structural elements of the same kind are represented by the same pattern, and redundant reference numerals are omitted as necessary for brevity in the figure.

As illustrated in FIG. 2, the radio frequency module 2 is formed by mounting the power amplification element 11, the transmission filter 12, the transmission matching element 13, the low noise amplification element 21, the reception filter 22, the reception matching element 23, and the antenna switch 31 on a first module board 41 and a second module board 42, which are arranged so as to face each other.

The first module board 41 has main surfaces 411 and 412, and the second module board 42 has main surfaces 421 and 422. Herein, a surface perpendicular to the thickness direction of a module board is defined as a main surface, and a surface including the thickness direction of the module board is defined as an end surface. The thickness of the module board does not have to be uniform, and a main surface may have steps or projections and depressions, which reflect unevenness of the thickness of the module board.

In the example in FIG. 2, the main surface 412 and the main surface 422 face each other, and the main surface 411 and the main surface 421 face away from each other. The direction in which the first module board 41 and the second module board 42 face each other (the Z direction in FIG. 2) is also called a stacking direction.

Each of the power amplification element 11, the transmission filter 12, the transmission matching element 13, the low noise amplification element 21, the reception filter 22, the reception matching element 23, and the antenna switch 31 is a surface-mount circuit component and has a connection electrode 81.

The first module board 41 is a single-sided mounting board where components are mountable at least on the main surface 411. The first module board 41 is a wiring board formed by stacking a plurality of base material layers formed of a resin or a ceramic, and pattern conductors 61 and 71 are formed in an inner layer 413 and on the main surface 411, respectively. The pattern conductor 61 is set to a ground potential and is used as a ground electrode. The pattern conductor 71 is used as a mounting electrode for mounting circuit components and as a wiring line for connecting the circuit components to each other.

The power amplification element 11, the transmission filter 12, and the transmission matching element 13 are mounted on the main surface 411 of the first module board 41. The power amplification element 11, the transmission filter 12, and the transmission matching element 13 are mounted on the main surface 411 of the first module board 41 by bonding the connection electrodes 81 and the pattern conductor 71 together using a conductive bonding material, such as solder.

A first coating layer 51 is formed on the main surface 411 of the first module board 41 so as to cover the main surface 411, the power amplification element 11, the transmission filter 12, and the transmission matching element 13. The first coating layer 51 is formed of a resin.

The second module board 42 is a double-sided mounting board where components are mountable on both the main surfaces 421 and 422. The second module board 42 is a wiring board formed by stacking a plurality of base material layers formed of a resin or a ceramic, and pattern conductors 62, 72, and 73 are formed in an inner layer 423 and on the main surfaces 421 and 422, respectively. The pattern conductor 62 is set to a ground potential and is used as a ground electrode. The pattern conductors 72 and 73 are used as mounting electrodes for mounting circuit components and as wiring lines that connect the circuit components to each other.

The low noise amplification element 21, the reception filter 22, and the reception matching element 23 are mounted on the main surface 421 of the second module board 42. The antenna switch 31 is mounted on the main surface 422. The low noise amplification element 21, the reception filter 22, and the reception matching element 23 are mounted on the main surface 421 of the second module board 42 by bonding the connection electrodes 81 and the pattern conductor 72 together using a conductive bonding material, such as solder. The antenna switch 31 is mounted on the main surface 422 of the second module board 42 by bonding the connection electrode 81 and the pattern conductor 73 together using a conductive bonding material, such as solder.

A second coating layer 52 is formed on the main surface 421 of the second module board 42 so as to cover the main surface 421, the low noise amplification element 21, the reception filter 22, and the reception matching element 23. A third coating layer 53 is formed on the main surface 422 so as to cover the main surface 422 and the antenna switch 31. The second coating layer 52 and the third coating layer 53 are formed of a resin.

The third coating layer 53 and the main surface 412 of the first module board 41 are bonded together (for example, by thermocompression bonding).

Columnar electrodes 86, which have a mounting structure for mounting the radio frequency module 2 on an external board 90, are provided on the main surface 421 of the second module board 42. The columnar electrodes 86, which are predetermined columnar electrodes, function as the antenna terminal ANT, the transmission signal terminal Tx, and the reception signal terminal Rx. The columnar electrodes 86 are formed of, for example, copper or a copper alloy. The second coating layer 52 is formed to cover side surfaces of the columnar electrodes 86 and expose end surfaces of the columnar electrodes 86 (the bottom surfaces in FIG. 2).

The first coating layer 51 forms the top surface of the radio frequency module 2 (the top surface in FIG. 2).

An interlayer electrode 83 is provided in the first module board 41, the second module board 42, and the third coating layer 53.

The interlayer electrodes 83 serve as wiring lines in the stacking direction and form a wiring line solely or together with the pattern conductors 71, 72, and 73, the wiring line connecting circuit components to each other. The columnar electrodes 86 are connected to components via the interlayer electrodes 83 and the pattern conductors 71, 72, and 73.

In addition to the wiring line, interlayer electrodes 83 and a columnar electrode 86, which penetrate through a plurality of layers including the second coating layer 52 and are connected to each other, form a through electrode 85, which transfers heat generated by a circuit component.

In the example in FIG. 2, the through electrode 85 is provided, which is connected to the connection electrode 81 at the center of the power amplification element 11 and penetrates through the first module board 41, the third coating layer 53, the second module board 42, and the second coating layer 52. Note that, the through electrode 85 may be formed by interlayer electrodes that are aligned with each other when viewed in the stacking direction and have a substantially straight shape as illustrated in FIG. 2 or may be formed by interlayer electrodes that overlap each other when viewed in the stacking direction and have a substantially step-like shape (not illustrated).

The through electrode 85 connects the circuit component to the mounting surface via the shortest route, and thus serves as a heat dissipation path with low thermal resistance.

The power amplification element 11, the transmission filter 12, the transmission matching element 13, the low noise amplification element 21, the reception filter 22, the reception matching element 23, the antenna switch 31, the antenna terminal ANT, the transmission signal terminal Tx, and the reception signal terminal Rx are connected by the pattern conductors 71, 72, and 73 and the interlayer electrodes 83. Consequently, the radio frequency module 2 corresponding to the radio frequency module 1 in FIG. 1 is obtained.

The radio frequency module 2 is mounted on the external board 90 by bonding the columnar electrodes 86 and mounting electrodes 91, which are provided on the external board 90, together using a conductive bonding material, such as solder. The external board 90 is, for example, a mother board included in a communication device that uses the radio frequency module 2.

In the radio frequency module 2, the power amplification element 11, the transmission filter 12, and the transmission matching element 13, which are transmission-only components, are mounted on the main surface 411 of the first module board 41. The low noise amplification element 21, the reception filter 22, and the reception matching element 23, which are reception-only components, are mounted on the main surface 421 of the second module board 42. The antenna switch 31, which is a transmission-reception dual-use component, is mounted on the main surface 422 of the second module board 42.

Consequently, compared with a configuration in which at least two components among a transmission-only component, a reception-only component, and a transmission-reception dual-use component are mounted on the same main surface of a module board, a transmission signal flowing through a transmission path including a transmission-only component and a transmission-reception dual-use component is less likely to enter a reception path including a reception-only component and a transmission-reception dual-use component, and thus the degree of transmission-reception isolation improves. Moreover, compared with an existing configuration in which circuit components are arranged in two layers by using both surfaces of a wiring board, it is possible to arrange a greater number of circuit components in an overlaying manner in the stacking direction, and thus the area of the radio frequency module can be reduced when viewed in the stacking direction.

Note that these effects can be obtained not only in the example of the radio frequency module 2 but also in a radio frequency module in which a transmission-only component, a reception-only component, and a transmission-reception dual-use component are arranged on three respective different main surfaces among the main surfaces 411 and 412 of the first module board 41 and the main surfaces 421 and 422 of the second module board 42. Thus, as long as a transmission-only component, a reception-only component, and a transmission-reception dual-use component are mounted on three respective different main surfaces, for example, even a radio frequency module in which a transmission-only component is mounted on the main surface 421 or the main surface 422 is included in the present disclosure.

With the radio frequency module 2, the following effects can be additionally obtained.

The power amplification element 11, the transmission filter 12, and the transmission matching element 13 are mounted on the main surface 411. Consequently, wiring lines between the power amplification element 11, the transmission filter 12, and the transmission matching element 13 are shortened, and thus the insertion loss of the transmission path can be reduced.

Moreover, the low noise amplification element 21, the reception filter 22, and the reception matching element 23 are mounted on the main surface 421. Consequently, wiring lines between the low noise amplification element 21, the reception filter 22, and the reception matching element 23 are shortened, and thus the insertion loss of the reception path can be reduced.

In the stacking direction, the main surface 422, on which the antenna switch 31 is mounted, is positioned between the main surface 411, on which the power amplification element 11 is mounted, and the main surface 421, on which the low noise amplification element 21 is mounted.

Consequently, it becomes easier to equalize the lengths of wiring lines from the antenna switch 31 to each of the power amplification element 11 and the low noise amplification element 21, and thus the case does not happen where only one of the insertion loss of the transmission path and that of the reception path considerably increases. Moreover, the main surfaces 411 and 421 sandwich the main surface 422 and are positioned on the opposite sides of the main surface 422, on which the antenna switch 31 is arranged, in the stacking direction. The power amplification element 11 and the low noise amplification element 21 are further apart from each other by being provided on the main surfaces 411 and 421, respectively, and thus the degree of transmission-reception isolation further improves.

Moreover, out of the main surface 412 of the first module board 41 and the main surface 422 of the second module board 42, which face each other, the antenna switch 31 is mounted only on the main surface 422. Components mounted on the main surfaces of two mounting boards that face each other are likely to be close to each other, and it is difficult to provide a pattern conductor as a ground electrode in a coating layer between the main surfaces that face each other. In terms of that point, in the radio frequency module 2, a reduction in the degree of transmission-reception isolation that may occur in a case where components are mounted on both the main surfaces 412 and 422 may be prevented by mounting the components only on one of the main surfaces 412 and 422.

Moreover, the columnar electrodes 86, which are for mounting the radio frequency module 2 on the external board 90, are provided on the main surface 421 different from the main surface 411, on which the power amplification element 11 is mounted. Consequently, heat generated by the power amplification element 11 can be dissipated to the external board 90 via the through electrode 85 directly connected to the connection electrode 81, and thus suitable heat dissipation characteristics are obtained.

In addition, the power amplification element 11 is mounted on the main surface 411, which is the main surface located on the opposite side in the stacking direction with respect to the main surface 421 where the columnar electrodes 86 are provided, that is, at a position closest to the top surface of the radio frequency module 2, heat emitted by the power amplification element 11 tends to be dissipated from the top surface of the radio frequency module 2, and thus the heat dissipation characteristics improve.

In addition, the pattern conductors 61 and 62 are provided as ground electrodes in the inner layer 413 of the first module board 41 and the inner layer 423 of the second module board 42, respectively. Consequently, the low noise amplification element 21 is shielded from both the power amplification element 11 and the antenna switch 31 by the pattern conductors 61 and 62, and thus the degree of transmission-reception isolation improves.

Note that it has been described that the first module board 41 is a single-sided mounting board and the second module board 42 is a double-sided mounting board in the radio frequency module 2; however, this arrangement may be vice versa. That is, the first module board 41 may be a double-sided mounting board, and the second module board 42 may be a single-sided mounting board. In that case, the first coating layer 51 and the third coating layer 53 are formed on the main surface 411 and the main surface 412 of the first module board 41, respectively. The second coating layer 52 is formed on the main surface 421 of the second module board 42. The third coating layer 53 and the main surface 422 of the second module board 42 are bonded together.

Modification of First Embodiment

Figure 3:
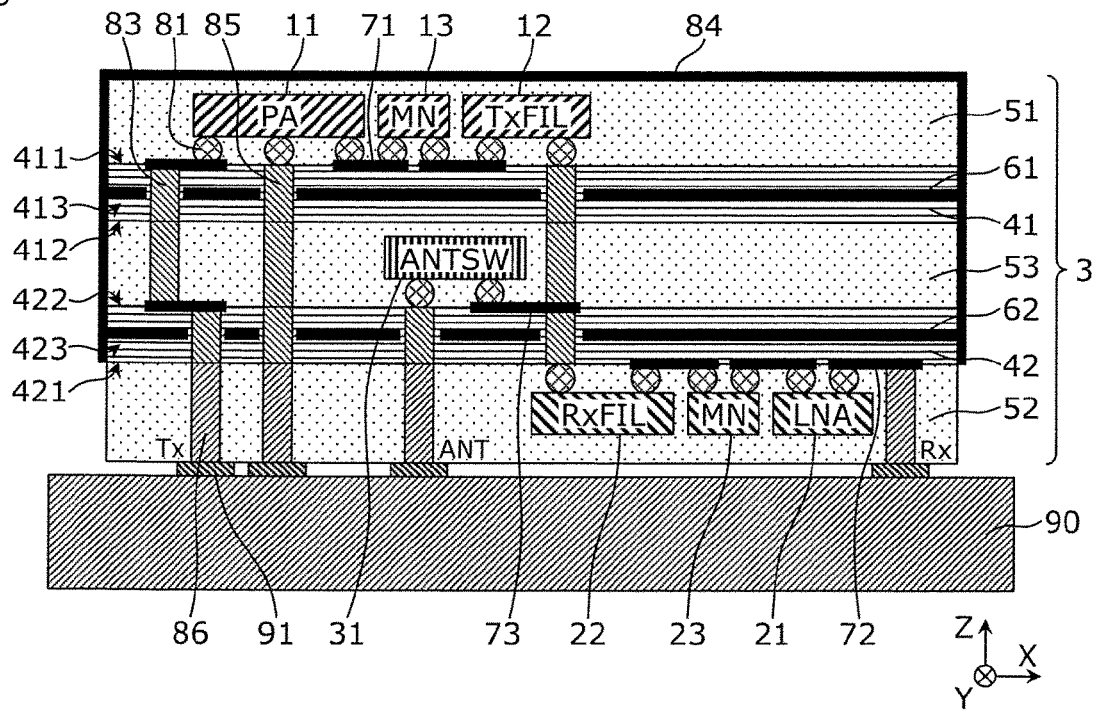
FIG. 3 is a side view illustrating an example of the configuration of a radio frequency module according to a modification of the first embodiment.

FIG. 3 is a side view illustrating a modification of the radio frequency module 2 according to the first embodiment. A radio frequency module 3 in FIG. 3 is formed by adding a shield electrode 84 to the radio frequency module 2 in FIG. 2. In the following, regarding the radio frequency module 3, a description of the same points as those of the radio frequency module 2 will be omitted, and different points will be mainly described.

In the radio frequency module 3 in FIG. 3, the shield electrode 84 is formed so as to cover at least end surfaces of the first module board 41, end surfaces of the second module board 42, the first coating layer 51, and the third coating layer 53. In addition, the shield electrode 84 is connected to the pattern conductors 61 and 62 serving as ground electrodes at the end surfaces of the first module board 41 and the second module board 42.

In the radio frequency module 3, the main surface 411, on which the power amplification element 11 is mounted, and the main surface 422, on which the antenna switch 31 is mounted, are shielded in all directions by the shield electrode 84 and the pattern conductors 61 and 62.

Consequently, a transmission signal flowing through a transmission path that includes the power amplification element 11 mounted on the main surface 411 and the antenna switch 31 mounted on the main surface 422 is less likely to enter a reception path that includes the low noise amplification element 21 mounted on the main surface 421, and thus the degree of transmission-reception isolation improves.

In addition, noise emitted to the outside from the transmission path and noise entering the transmission path from the outside are suppressed, and thus the low-noise property improves.

Furthermore, heat generated by the power amplification element 11 can be dissipated via the shield electrode 84, and thus the heat dissipation characteristics improve.

Second Embodiment

Figure 4:
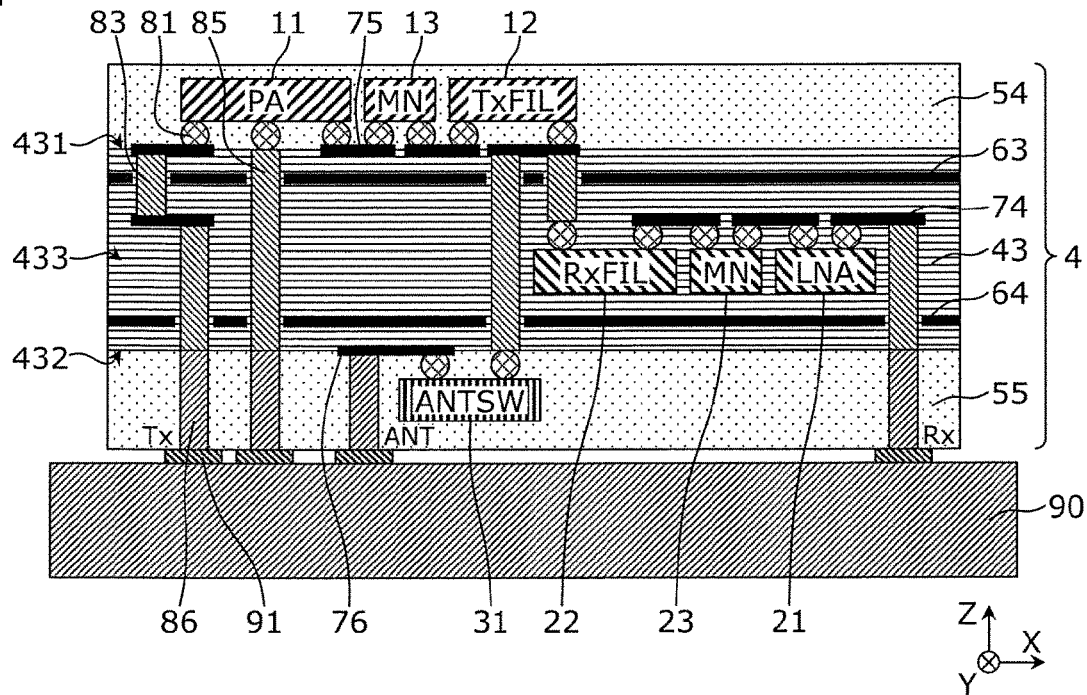
FIG. 4 is a side view illustrating an example of the configuration of a radio frequency module according to a second embodiment.

FIG. 4 is a side view illustrating an example of the configuration of a radio frequency module according to a second embodiment. A radio frequency module 4 in FIG. 4 illustrates another example of the specific configuration of the radio frequency module 1 in FIG. 1. Note that, in FIG. 4, structural elements of the same kind are represented by the same pattern, and redundant reference numerals are omitted as necessary for brevity in the figure.

As illustrated in FIG. 4, the radio frequency module 4 is formed by mounting the power amplification element 11, the transmission filter 12, the transmission matching element 13, the low noise amplification element 21, the reception filter 22, the reception matching element 23, and the antenna switch 31 on and in a third module board 43.

The third module board 43 has main surfaces 431 and 432 and an inner layer 433.

Each of the power amplification element 11, the transmission filter 12, the transmission matching element 13, the low noise amplification element 21, the reception filter 22, the reception matching element 23, and the antenna switch 31 is a surface-mount circuit component and has the connection electrode 81.

The third module board 43 is a double-sided mounting board in which circuit components can be built. The third module board 43 is a wiring board formed by stacking a plurality of base material layers formed of a resin or a ceramic. Pattern conductors 63, 64, and 74 are formed in the inner layer 433, and pattern conductors 75 and 76 are formed on the main surfaces 431 and 432, respectively.

In the inner layer 433 of the third module board 43, the pattern conductors 63 and 64 are respectively provided between the low noise amplification element 21, reception filter 22, and reception matching element 23 and the main surface 431 and between the low noise amplification element 21, reception filter 22, and reception matching element 23 and the main surface 432 and are set to a ground potential and used as ground electrodes. The pattern conductors 74, 75, and 76 are used as mounting electrodes for mounting circuit components and as wiring lines that connect the circuit components to each other.

In the inner layer 433 of the third module board 43, the low noise amplification element 21, the reception filter 22, and the reception matching element 23 are mounted. The power amplification element 11, the transmission filter 12, and the transmission matching element 13 are mounted on the main surface 431, and the antenna switch 31 is mounted on the main surface 432.

The low noise amplification element 21, the reception filter 22, and the reception matching element 23 are, for example, housed in a cavity provided in the inner layer 433 by removing some of the base material layers forming the third module board 43.

The power amplification element 11, the transmission filter 12, and the transmission matching element 13 are mounted on the main surface 431 of the third module board 43 by bonding the connection electrodes 81 and the pattern conductor 75 together using a conductive bonding material, such as solder. The antenna switch 31 is mounted on the main surface 432 of the third module board 43 by bonding the connection electrode 81 and the pattern conductor 76 together using a conductive bonding material, such as solder.

A fourth coating layer 54 is formed on the main surface 431 of the third module board 43 so as to cover the main surface 431, the power amplification element 11, the transmission filter 12, and the transmission matching element 13. A fifth coating layer 55 is formed on the main surface 432 so as to cover the main surface 432 and the antenna switch 31. The fourth coating layer 54 and the fifth coating layer 55 are formed of a resin.

Columnar electrodes 86, which have a mounting structure for mounting the radio frequency module 4 on the external board 90, are provided on the main surface 432 of the third module board 43. The columnar electrodes 86, which are predetermined columnar electrodes, function as the antenna terminal ANT, the transmission signal terminal Tx, and the reception signal terminal Rx. The columnar electrodes 86 are formed of, for example, copper or a copper alloy. The fifth coating layer 55 is formed to cover side surfaces of the columnar electrodes 86 and expose end surfaces of the columnar electrodes 86 (the bottom surfaces in FIG. 4).

The fourth coating layer 54 forms a top surface of the radio frequency module 4 (the top surface in FIG. 4).

The interlayer electrodes 83 are provided in the inner layer 433 of the third module board 43.

The interlayer electrodes 83 serve as wiring lines in the stacking direction and forms a wiring line solely or together with the pattern conductors 74, 75, and 76, the wiring line connecting circuit components to each other. The columnar electrodes 86 are connected to components via the interlayer electrodes 83 and the pattern conductors 74, 75, and 76.

In the example in FIG. 4, a wiring line that connects the connection electrode 81 at the left end of the power amplification element 11 to the transmission signal terminal Tx is formed by the pattern conductors 74 and 75 and the interlayer electrodes 83. The wiring line may be connected to a circuit component other than the power amplification element 11 and the transmission signal terminal Tx, the circuit component being not illustrated (for example, an inductor element for matching or the like). A portion of the wiring line may be formed to pass through a circuit component other than the pattern conductors 74 and 75 and the interlayer electrodes 83, the circuit component being not illustrated. Alternatively, the wiring line that connects the power amplification element 11 to the transmission signal terminal Tx may be formed only by the interlayer electrodes 83.

In addition to the wiring line, interlayer electrodes 83 and a columnar electrode 86, which penetrate through a plurality of layers including the fifth coating layer 55 and are connected to each other, form a through electrode 85, which transfers heat generated by a circuit component.

In the example in FIG. 4, the through electrode 85 is provided, which is connected to the connection electrode 81 at the center of the power amplification element 11 and penetrates through the third module board 43 and the fifth coating layer 55. Note that, the through electrode 85 may be formed by interlayer electrodes that are aligned with each other when viewed in the stacking direction and have a substantially straight shape as illustrated in FIG. 4 or may be formed by interlayer electrodes that overlap each other when viewed in the stacking direction and have a substantially step-like shape (not illustrated).

The through electrode 85 connects the circuit component to the mounting surface via the shortest route, and thus serves as a heat dissipation path with low thermal resistance.

The power amplification element 11, the transmission filter 12, the low noise amplification element 21, the reception filter 22, the antenna switch 31, the antenna terminal ANT, the transmission signal terminal Tx, and the reception signal terminal Rx are connected by the pattern conductors 74, 75, and 76 and the interlayer electrodes 83. Consequently, the radio frequency module 4 corresponding to the radio frequency module 1 in FIG. 1 is obtained.

The radio frequency module 4 is mounted on the external board 90 by bonding the columnar electrodes 86 and mounting electrodes 91, which is provided on the external board 90, together using a conductive bonding material, such as solder. The external board 90 is, for example, a mother board included in a communication device that uses the radio frequency module 4.

In the radio frequency module 4, the power amplification element 11, the transmission filter 12, and the transmission matching element 13, which are transmission-only components, are mounted on the main surface 431 of the third module board 43. The low noise amplification element 21, the reception filter 22, and the reception matching element 23, which are reception-only components, are mounted in the inner layer 433 of the third module board 43. The antenna switch 31, which is a transmission-reception dual-use component, is mounted on the main surface 432 of the third module board 43.

Consequently, compared with a configuration in which at least two components among a transmission-only component, a reception-only component, and a transmission-reception dual-use component are mounted on the same main surface or in an inner layer of a module board, a transmission signal flowing through a transmission path including a transmission-only component and a transmission-reception dual-use component is less likely to enter a reception path including a reception-only component and a transmission-reception dual-use component, and thus the degree of transmission-reception isolation improves. Moreover, compared with an existing configuration in which circuit components are arranged in two layers by using both surfaces of a wiring board, it is possible to arrange a greater number of circuit components in an overlaying manner in the stacking direction, and thus the area of the radio frequency module can be reduced when viewed in the stacking direction.

Note that these effects can be obtained not only in the example of the radio frequency module 4 but also in a radio frequency module in which a transmission-only component, a reception-only component, and a transmission-reception dual-use component are assigned to the respective different main surfaces and inner layer among the main surfaces 431 and 432 and the inner layer 433 of the third module board 43 and are arranged. Thus, as long as a transmission-only component, a reception-only component, and a transmission-reception dual-use component are assigned to the respective different main surfaces and inner layer of the third module board 43 and are arranged, for example, even a radio frequency module in which a transmission-only component is arranged in the inner layer 433 or on the main surface 432 is included in the present disclosure.

With the radio frequency module 4, the following effects can be additionally obtained.

The power amplification element 11, the transmission filter 12, and the transmission matching element 13 are mounted on the main surface 431. Consequently, wiring lines between the power amplification element 11, the transmission filter 12, and the transmission matching element 13 are shortened, and thus the insertion loss of the transmission path can be reduced.

Moreover, the low noise amplification element 21, the reception filter 22, and the reception matching element 23 are mounted in the inner layer 433. Consequently, wiring lines between the low noise amplification element 21, the reception filter 22, and the reception matching element 23 are shortened, and thus the insertion loss of the reception path can be reduced.

Moreover, the columnar electrodes 86 for mounting the radio frequency module 4 on the external board 90 are provided on the main surface 432, which is different from the main surface 431, where the power amplification element 11 is arranged. Consequently, heat generated by the power amplification element 11 can be dissipated to the external board 90 via the through electrode 85 directly connected to the connection electrode 81, and thus suitable heat dissipation characteristics are obtained.

In addition, the power amplification element 11 is mounted on the main surface 431, which is the main surface located on the opposite side in the stacking direction with respect to the main surface 432 where the columnar electrodes 86 are provided, that is, at a position closest to the top surface of the radio frequency module 4, heat generated by the power amplification element 11 tends to be dissipated from the top surface of the radio frequency module 4, and thus the heat dissipation characteristics improve.

In addition, the pattern conductors 63 and 64 are provided as ground electrodes in the inner layer 433 of the third module board 43. Consequently, the low noise amplification element 21 is shielded from both the power amplification element 11 and the antenna switch 31, and thus the degree of transmission-reception isolation improves.

Modification of Second Embodiment

Figure 5:
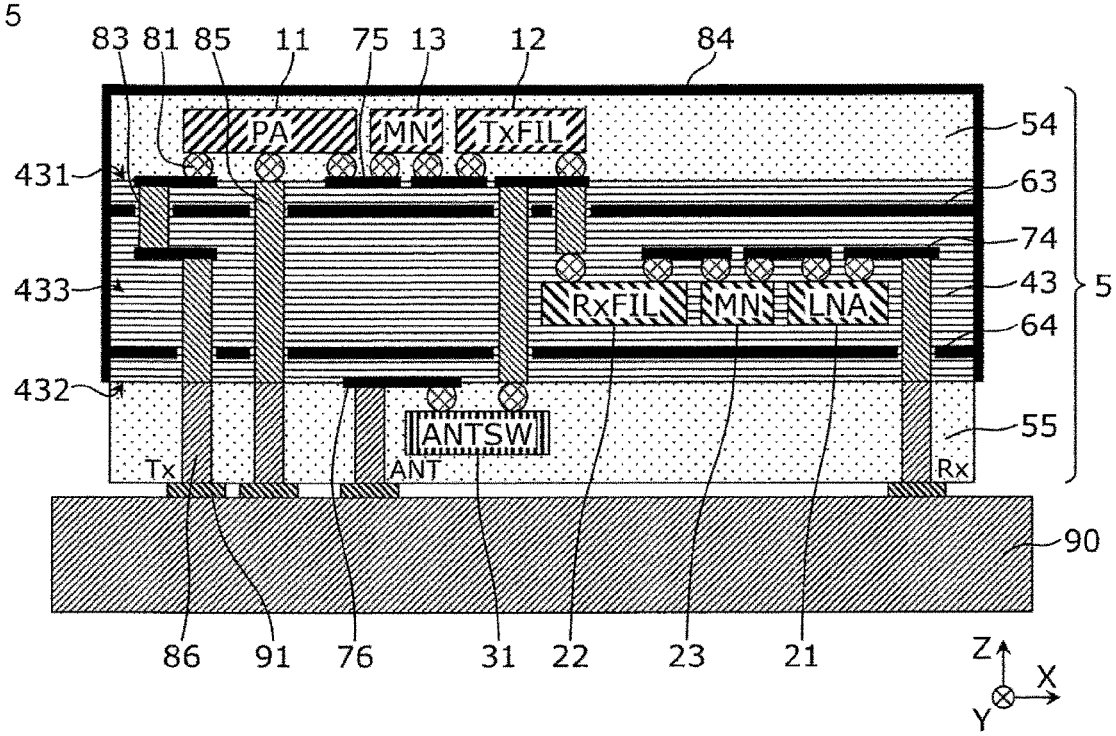
FIG. 5 is a side view illustrating an example of the configuration of a radio frequency module according to a modification of the second embodiment.

FIG. 5 is a side view illustrating a modification of the radio frequency module 4 according to the second embodiment. A radio frequency module 5 in FIG. 5 is formed by adding the shield electrode 84 to the radio frequency module 4 in FIG. 4. In the following, regarding the radio frequency module 5, a description of the same points as those of the radio frequency module 4 will be omitted, and different points will be mainly described.

In the radio frequency module 5 in FIG. 5, the shield electrode 84 is formed so as to cover at least end surfaces of the third module board 43 and the fourth coating layer 54. In addition, the shield electrode 84 is connected to the pattern conductors 63 and 64 serving as ground electrodes at the end surfaces of the third module board 43.

In the radio frequency module 5, the main surface 431, on which the power amplification element 11 is mounted, and the inner layer 433, in which the low noise amplification element 21 is arranged, are shielded in all directions by the shield electrode 84 and the pattern conductors 63 and 64.

Consequently, a transmission signal flowing through a transmission path that includes the power amplification element 11 mounted on the main surface 431 is less likely to enter a reception path that includes the low noise amplification element 21 mounted in the inner layer 433, and thus the degree of transmission-reception isolation improves.

In addition, noise entering the reception path from the outside, noise emitted to the outside from the transmission path, and noise entering the transmission path from the outside are suppressed, and thus the low-noise property improves.

Furthermore, heat generated by the power amplification element 11 can be dissipated via the shield electrode 84, and thus the heat dissipation characteristics improve.

Third Embodiment

Figure 6:
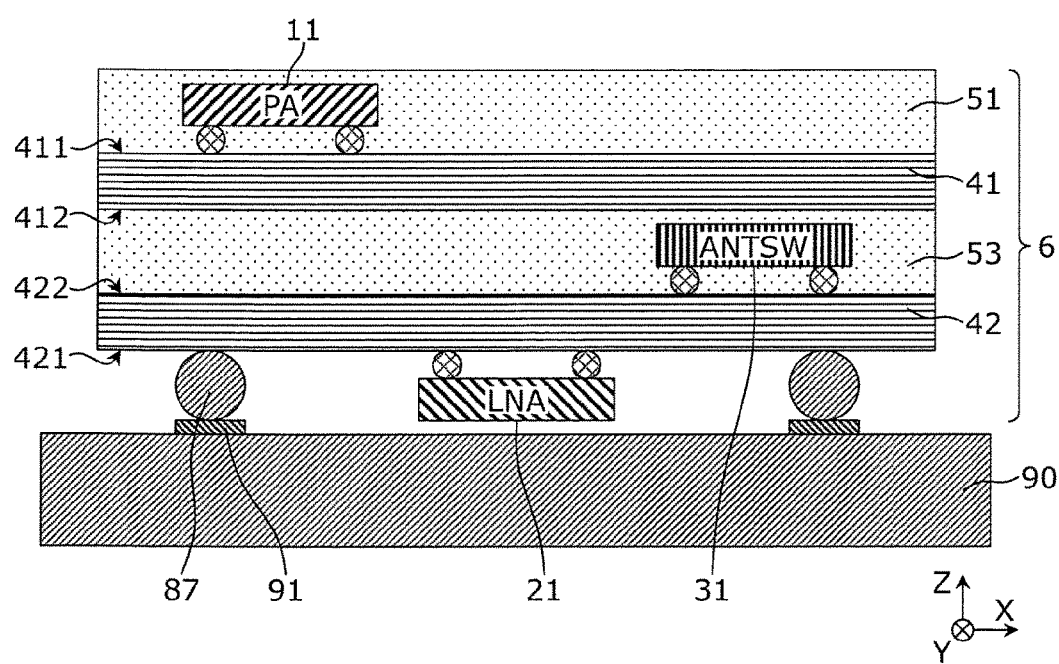
FIG. 6 is a side view illustrating an example of the configuration of a radio frequency module according to a third embodiment.

FIG. 6 is a side view illustrating an example of the configuration of a radio frequency module according to a third embodiment. A radio frequency module 6 in FIG. 6 illustrates an example of the specific configuration of the radio frequency module 1 in FIG. 1.

As illustrated in FIG. 6, the radio frequency module 6 differs from the radio frequency module 2 in FIG. 2 in that, as a mounting structure, solder balls 87 are provided instead of the columnar electrodes and the second coating layer 52 is not included. Note that, in FIG. 6, a transmission filter, a transmission matching element, a reception filter, a reception matching element, pattern conductors, and interlayer electrodes are omitted for brevity in the figure.

Each solder ball 87 is connected to a component with an interlayer electrode and a pattern conductor, which are not illustrated, interposed therebetween. The radio frequency module 6 is mounted on the external board 90 via the solder balls 87. The external board 90 is, for example, a mother board included in a communication device that uses the radio frequency module 6.

Although not illustrated, a sealing member may be provided on a portion of the region of the main surface 421 so as to cover the low noise amplification element 21, and an underfilling agent may be filled in the gap between the low noise amplification element 21 and the main surface 421.

In the radio frequency module 6, similarly to as in the radio frequency module 2, the power amplification element 11, which is a transmission-only component, is mounted on the main surface 411 of the first module board 41. Moreover, the low noise amplification element 21, which is a reception-only component, and the antenna switch 31, which is a transmission-reception dual-use component, are mounted on the main surfaces 421 and 422 of the second module board 42, respectively.

Consequently, compared with a configuration in which at least two components among a transmission-only component, a reception-only component, and a transmission-reception dual-use component are mounted on the same main surface of a module board, a transmission signal flowing through a transmission path including a transmission-only component and a transmission-reception dual-use component is less likely to enter a reception path including a reception-only component and a transmission-reception dual-use component, and thus the degree of transmission-reception isolation improves. Moreover, compared with an existing configuration in which circuit components are arranged in two layers by using both surfaces of a wiring board, it is possible to arrange a greater number of circuit components in an overlaying manner in the stacking direction, and thus the area of the radio frequency module can be reduced when viewed in the stacking direction.

Fourth Embodiment

Figure 7:
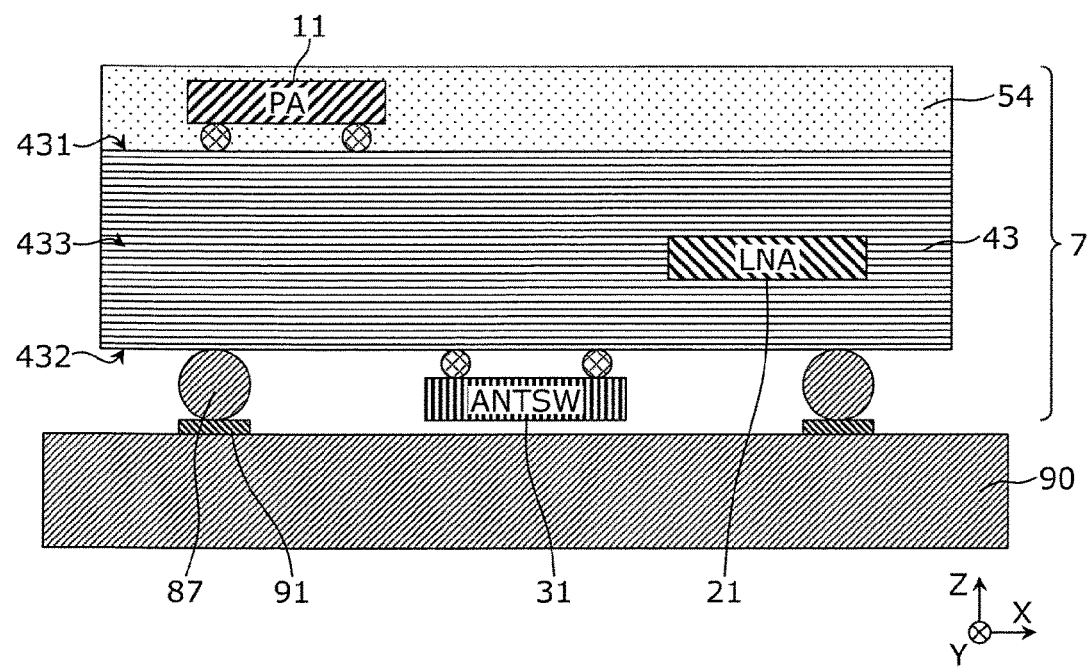
FIG. 7 is a side view illustrating an example of the configuration of a radio frequency module according to a fourth embodiment.

FIG. 7 is a side view illustrating an example of the configuration of a radio frequency module according to a fourth embodiment. A radio frequency module 7 in FIG. 7 illustrates an example of the specific configuration of the radio frequency module 1 in FIG. 1.

As illustrated in FIG. 7, the radio frequency module 7 differs from the radio frequency module 4 in FIG. 4 in that, as a mounting structure, the solder balls 87 are provided instead of the columnar electrodes and the fifth coating layer 55 is not included. Note that, in FIG. 7, a transmission filter, a transmission matching element, a reception filter, a reception matching element, pattern conductors, and interlayer electrodes are omitted for brevity in the figure.

Each solder ball 87 is connected to a component with an interlayer electrode and a pattern conductor, which are not illustrated, interposed therebetween. The radio frequency module 7 is mounted on the external board 90 via the solder balls 87, for example, by reflow processing. The external board 90 is, for example, a mother board included in a communication device that uses the radio frequency module 7.

Although not illustrated, a sealing member may be provided on a portion of the region of the main surface 432 so as to cover the antenna switch 31, and an underfilling agent may be filled in the gap between the antenna switch 31 and the main surface 432.

In the radio frequency module 7, similarly to as in the radio frequency module 4, the power amplification element 11, which is a transmission-only component, and the antenna switch 31, which is a transmission-reception dual-use component, are mounted on the main surfaces 431 and 432 of the third module board 43, respectively. Moreover, the low noise amplification element 21, which is a reception-only component, is mounted in the inner layer 433 of the third module board 43.

Consequently, compared with a configuration in which at least two components among a transmission-only component, a reception-only component, and a transmission-reception dual-use component are mounted on the same main surface or in an inner layer of a module board, a transmission signal flowing through a transmission path including a transmission-only component and a transmission-reception dual-use component is less likely to enter a reception path including a reception-only component and a transmission-reception dual-use component, and thus the degree of transmission-reception isolation improves. Moreover, compared with an existing configuration in which circuit components are arranged in two layers by using both surfaces of a wiring board, it is possible to arrange a greater number of circuit components in an overlaying manner in the stacking direction, and thus the area of the radio frequency module can be reduced when viewed in the stacking direction.

The radio frequency modules according to the embodiments of the present disclosure have been described above; however, the present disclosure is not limited to each of the embodiments. Without necessarily departing from the gist of the present disclosure, modifications obtained by adding various types of changes that those skilled in the art can conceive and forms realized by combining structural elements from different embodiments may also be included in the present disclosure.

For example, a radio frequency module does not have to include all of a transmission-only component, a reception-only component, and a transmission-reception dual-use component.

A radio frequency module may include a first component and a second component and may also include a first module board and a second module board. The first component is one of a transmission-only component, a reception-only component, and a transmission-reception dual-use component. The second component is another one of the transmission-only component, the reception-only component, and the transmission-reception dual-use component. The first module board and the second module board are arranged so as to face each other. The radio frequency module does not have to include a third component, which differs from both the first component and the second component and is one of the transmission-only component, the reception-only component, and the transmission-reception dual-use component.

In this case, the first component is mounted on a first main surface, and the second component is mounted on a second main surface. The first main surface is one of four main surfaces, which are one main surface and the other main surface of the first module board and one main surface and the other main surface of the second module board. The second main surface differs from the first main surface and is one of the four main surfaces.

Consequently, two components among the transmission-only component, the reception-only component, and the transmission-reception dual-use component are assigned to and mounted on respective different main surfaces of the module boards. As a result, a transmission signal flowing through a transmission path including at least one of the transmission-only component and the transmission-reception dual-use component is less likely to enter a reception path including at least one of the reception-only component and the transmission-reception dual-use component, and thus the degree of transmission-reception isolation improves.

The radio frequency module may further include the third component, which differs from both the first component and the second component and is one of the transmission-only component, the reception-only component, and the transmission-reception dual-use component, and the third component may be mounted on a third main surface, which differs from both the first main surface and the second main surface and is one of the four main surfaces.

Consequently, in a case where the radio frequency module includes all of the transmission-only component, the reception-only component, and the transmission-reception dual-use component, all the components are assigned to and mounted on respective different main surfaces of the module boards. As a result, a transmission signal flowing through a transmission path including the transmission-only component and the transmission-reception dual-use component is less likely to enter a reception path including the reception-only component and the transmission-reception dual-use component, and thus the degree of transmission-reception isolation improves.

In addition, a radio frequency module may include a fourth component and a fifth component and may also include a third module board. The fourth component is one of a transmission-only component, a reception-only component, and a transmission-reception dual-use component. The fifth component is another one of the transmission-only component, the reception-only component, and the transmission-reception dual-use component. The radio frequency module does not have to include a sixth component, which differs from both the fourth component and the fifth component and is one of the transmission-only component, the reception-only component, and the transmission-reception dual-use component.

In this case, the fourth component is mounted on a fourth main surface, which is one main surface of the third module board, and the fifth component is mounted in an inner layer of the third module board.

Consequently, two components among the transmission-only component, the reception-only component, and the transmission-reception dual-use component are each assigned to a corresponding one of the main surface and inner layer of the module board and are mounted on the main surface and in the inner layer of the module board. As a result, a transmission signal flowing through a transmission path including at least one of the transmission-only component and the transmission-reception dual-use component is less likely to enter a reception path including at least one of the reception-only component and the transmission-reception dual-use component, and thus the degree of transmission-reception isolation improves.

The radio frequency module may further include the sixth component, which differs from both the fourth component and the fifth component and is one of the transmission-only component, the reception-only component, and the transmission-reception dual-use component. The sixth component may be mounted on a fifth main surface, which is the other main surface of the third module board.

Consequently, in a case where the radio frequency module includes all of the transmission-only component, the reception-only component, and the transmission-reception dual-use component, all the components are each assigned to a corresponding one of the main surfaces and inner layer of the module board and are mounted on the main surfaces and in the inner layer of the module board. As a result, a transmission signal flowing through a transmission path including the transmission-only component and the transmission-reception dual-use component is less likely to enter a reception path including the reception-only component and the transmission-reception dual-use component, and thus the degree of transmission-reception isolation improves.

In the description above, the configurations for improving the degree of transmission-reception isolation have been described using, as an example, a transmission-only component, a reception-only component, and a transmission-reception dual-use component; however, the degree of isolation between frequency bands can also be improved by using a similar configuration.

For example, a first-band component, a second-band component, and a dual-band component are considered. The first-band component processes only a first signal in a first frequency band. The second-band component processes only a second signal in a second frequency band, which is different from the first frequency band. The dual-band component processes both the first signal and the second signal. In this case, each of the first signal and the second signal may be a transmission signal or a reception signal.

A radio frequency module may include a first component and a second component and may also include a first module board and a second module board. The first component is one of a first-band component, a second-band component, and a dual-band component. The second component is another one of the first-band component, the second-band component, and the dual-band component. The first module board and the second module board are arranged so as to face each other. In this case, the first component is mounted on a first main surface, which is one of four main surfaces, which are one main surface and the other main surface of the first module board and one main surface and the other main surface of the second module board, and the second component is mounted on a second main surface, which differs from the first main surface and is another one of the four main surfaces.

In addition, a radio frequency module may include a fourth component and a fifth component and may also include a third module board. The fourth component is one of a first-band component, a second-band component, and a dual-band component. The fifth component is another one of the first-band component, the second-band component, and the dual-band component. In this case, the fourth component is mounted on a fourth main surface, which is one main surface of the third module board, and the fifth component is mounted in the inner layer of the third module board.

Consequently, two components among the first-band component, the second-band component, and the dual-band component are assigned to and mounted on respective different main surfaces of the module boards, or are each assigned to a corresponding one of the main surface and the inner layer of the module board and are mounted on the main surface and in the inner layer of the module board. As a result, a first signal flowing through a signal path including at least one of the first-band component and the dual-band component is less likely to enter a signal path including at least one of the second-band component and the dual-band component, and thus the degree of band-band isolation improves.

A radio frequency module may include all of the first-band component, the second-band component, and the dual-band component.

The present disclosure may be widely used in communication devices, such as mobile phones, as a radio frequency module arranged in a multiband front-end portion.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A radio frequency module comprising:
   a first circuit component being a transmission-only component configured to process only a transmission signal;
   a second circuit component being a transmission-reception dual-use component configured to process both the transmission signal and a reception signal; and
   a third circuit component different than the first circuit component and the second circuit component, the third circuit component being a reception-only component configured to process only the reception signal,
   wherein the first circuit component is mounted on a first main surface, the first main surface being a main surface of a first module board,
   wherein the second circuit component is mounted on a second main surface in a stacking direction of the first module board or the second module board, the second main surface being different than the first main surface,
   wherein the third circuit component is mounted on a third main surface, the third main surface being a main surface of the second module board and different than the first and second main surfaces,
   wherein the first and third main surfaces face away from each other, and
   wherein the third main surface comprises a first mounting structure configured to mount the radio frequency module on an external board.

2. The radio frequency module according to claim 1, wherein:
   the transmission-only component comprises a transmission amplification circuit element, a transmission filter, or a transmission impedance matching circuit element, the transmission amplification circuit element being configured to amplify the transmission signal, the transmission filter being configured to filter the transmission signal, and the transmission impedance matching circuit element being configured to match a signal path through which the transmission signal flows,
   the reception-only component comprises a reception amplification circuit element, a reception filter, or a reception impedance matching circuit element, the reception amplification circuit element being configured to amplify the reception signal, the reception filter being configured to filter the reception signal, and the reception impedance matching circuit element being configured to match a signal path through which the reception signal flows, and
   the transmission-reception dual-use component comprises an antenna switch or a duplexer, the antenna switch being configured to selectively connect the signal path through which the transmission signal flows or the signal path through which the reception signal flows, and the duplexer being configured to demultiplex and multiplex the transmission signal and the reception signal.

3. The radio frequency module according to claim 1 further comprising a first ground electrode and a second ground electrode in an inner layer of the first module board and an inner layer of the second module board, respectively.

4. The radio frequency module according to claim 3, further comprising:
   a first coating layer covering the first main surface and the first circuit component; and
   a first shield electrode covering at least an end surface of the first module board, an end surface of the second module board, and the first coating layer, the first shield electrode being connected to the first ground electrode and the second ground electrode at the end surface of the first module board and the end surface of the second module board.

5. The radio frequency module according to claim 3, wherein:
   the first mounting structure is a columnar electrode connected to the first circuit component, the second circuit component, or the third circuit component, and
   the radio frequency module further comprises a second coating layer on the third main surface, the second coating layer covering a side surface of the columnar electrode and exposing an end surface of the columnar electrode.

6. The radio frequency module according to claim 3, wherein the first mounting structure is a solder ball connected to the first circuit component, the second circuit component, or the third circuit component.

7. The radio frequency module according to claim 1, wherein:
   each of the transmission-only component, the reception-only component and the transmission-reception dual-use component is mounted on different main surfaces of the first module board and the second module board, respectively, and
   the transmission-reception dual-use component is mounted in a middle area of one of the different main surfaces of the first module board and the second module board.

8. The radio frequency module according to claim 1, wherein the transmission-only component includes a transmission filter, the reception-only component includes a reception filter, and the transmission-reception dual-use component includes an antenna switch.

9. A radio frequency module comprising:
   a fourth circuit component being a transmission-only component configured to process only a transmission signal;

a fifth circuit component being a reception-only component configured to process only a reception signal;

a sixth circuit component different than the fourth circuit component and the fifth circuit component, the sixth circuit component being a transmission-reception dual-use component configured to process both the transmission signal and the reception signal; and a third module board, wherein the fourth circuit component is mounted on a main surface of the third module board, wherein the fifth circuit component is mounted in an inner layer of the third module board, wherein the sixth circuit component is mounted on another main surface of the third module board, wherein the other main surface of the third module board comprises a second mounting structure configured to mounting the radio frequency module on an external board.

10. The radio frequency module according to claim 9, wherein:

the transmission-only component comprises a transmission amplification circuit element, a transmission filter, or a transmission impedance matching circuit element, the transmission amplification circuit element being configured to amplify the transmission signal, the transmission filter being configured to filter the transmission signal, and the transmission impedance matching circuit element being configured to match a signal path through which the transmission signal flows, the reception-only component comprises a reception amplification circuit element, a reception filter, or a reception impedance matching circuit element, the reception amplification circuit element being configured to amplify the reception signal, the reception filter being configured to filter the reception signal, and the reception impedance matching circuit element being configured to match a signal path through which the reception signal flows, and the transmission-reception dual-use component comprises an antenna switch or a duplexer, the antenna switch being configured to selectively connect the signal path through which the transmission signal flows or the signal path through which the reception signal flows, and the duplexer being configured to demultiplex and multiplex the transmission signal and the reception signal.

11. The radio frequency module according to claim 9, further comprising a third ground electrode and a fourth ground electrode, wherein in a thickness direction of the third module board:

the third ground electrode is in the inner layer of the third module board between the fifth circuit component (RX only) and the main surface of the third module board, and the fourth ground electrode is in in the inner layer of the third module board between the fifth circuit component and the other main surface of the third module board.

12. The radio frequency module according to claim 11, further comprising:

a third coating layer covering the main surface of the third module board and the fourth circuit component; and a second shield electrode covering at least an end surface of the third module board and the third coating layer, and being connected to the third ground electrode and the fourth ground electrode at the end surface of the third module board.

13. The radio frequency module according to claim 9, wherein:

the second mounting structure is a columnar electrode connected to the fourth circuit component, the fifth circuit component, or the sixth circuit component, and a fourth coating layer on a fifth main surface of the third module board, the fourth coating layer covering a side surface of the columnar electrode and exposing an end surface of the columnar electrode.

14. The radio frequency module according to claim 9, wherein the second mounting structure is a solder ball connected to the fourth circuit component, the fifth circuit component, or the sixth circuit component.

15. The radio frequency module according to claim 9, wherein the transmission-only component includes a transmission filter, and the reception-only component includes a reception filter, and the transmission-reception dual-use component includes an antenna switch.

* * * * *